(12) United States Patent
Satonaga et al.

(10) Patent No.: US 7,413,606 B2
(45) Date of Patent: Aug. 19, 2008

(54) METHOD FOR PRODUCING CRYSTAL OF FLUORIDE

(75) Inventors: Tomohiko Satonaga, Osaka (JP); Hirohisa Kikuyama, Osaka (JP); Tsuguo Fukuda, Miyagi (JP)

(73) Assignees: Stella Chemifa Corporation, Osaka (JP); Fukuda Crystal Laboratory, Miyagi (JP)

( * ) Notice: Subject to any disclaimer, the term of this patent is extended or adjusted under 35 U.S.C. 154(b) by 69 days.

(21) Appl. No.: 10/564,283

(22) PCT Filed: Jul. 20, 2004

(86) PCT No.: PCT/JP2004/010312

§ 371 (c)(1),
(2), (4) Date: May 25, 2006

(87) PCT Pub. No.: WO2005/007943

PCT Pub. Date: Jan. 27, 2005

(65) Prior Publication Data

US 2007/0095273 A1     May 3, 2007

(30) Foreign Application Priority Data

Jul. 17, 2003   (JP)  ............................. 2003-276347

(51) Int. Cl.
*C30B 15/20*     (2006.01)

(52) U.S. Cl. .............................. 117/23; 117/13; 117/27
(58) Field of Classification Search ................... 117/13, 117/23, 27
See application file for complete search history.

(56) References Cited

U.S. PATENT DOCUMENTS 3,915,656 A * 10/1975 Mlavsky et al. ............. 117/205
4,915,773 A * 4/1990 Kravetsky et al. ............. 117/16

FOREIGN PATENT DOCUMENTS

| JP | 8-259375 | 10/1996 |
|----|----------|---------|
| JP | 10-265293 | 10/1998 |

OTHER PUBLICATIONS

T. Fukuda et al., Crystal growth of oxide and fluoride materials for optical, piezoelectric and other applications, Journal of Materials Science, Materials in Electronics, 1999, vol. 10, pp. 571 to 580.

* cited by examiner

*Primary Examiner*—Felisa Hiteshew
(74) *Attorney, Agent, or Firm*—Young & Thompson

(57) ABSTRACT

It is aimed at providing a fluoride crystal growing method capable of controlling a shape of the crystal by a micro-pulling-down method. Fluoride crystals in shapes depending on purposes, respectively, can be grown by adopting carbon, platinum, and iridium as crucible materials adaptable to fluorides, respectively, and by designing shapes of the crucibles taking account of wettabilities of the materials with the fluorides, respectively.

11 Claims, 5 Drawing Sheets exterior of crucib
crucible bottom surface
hole

METHOD FOR PRODUCING CRYSTAL OF FLUORIDE

TECHNICAL FIELD

The present invention relates to a fluoride crystal production method.

BACKGROUND ART

Patent-Related Reference 1: Japanese Patent Application No. 2003-119000

Patent-related Reference 2: JP-A-10-265293

Patent-related Reference 3: JP-A-8-259375

Patent-unrelated reference 1: Applied Physics Handbook, second edition, p427, MARUZEN Co., Ltd.

Highly integrated semiconductor devices have brought about various light sources at shorter wavelengths, and the needs thereof have reached a vacuum ultraviolet range. Utilized as an optical material in this wavelength range is a fluoride crystal exhibiting an excellent transmissivity, and a single crystal of fluoride such as calcium fluoride is used as an optical material for optical lithography where ArF excimer laser (193 nm) and $F_2$ excimer laser (157 nm) are used, for example. Additionally, it is earnestly desired to develop a novel fluoride crystal usable as: a crystal for all-solid-state ultraviolet/infrared laser; a window material for an ultraviolet range; an optical material for a medical treatment; and the like.

These fluoride crystals are each grown as a bulk single crystal mainly by a Bridgman method, a Cz method, or the like, thereafter worked by cutting, and used for various usage and for measurement. However, such methods require enormous costs and a number of days to obtain a single crystal, thereby bringing about an obstruction to a development speed of a novel material.

Meanwhile, concerning production of a single crystal and eutectic crystal of oxide, and production of Si, there has been known a micro-pulling-down method (patent-related reference 2, patent-related reference 3, and patent-unrelated reference 1). For example, the patent-related reference 2 describes a definite apparatus, at its paragraph numbered (0025) and in its FIG. 1.

In the techniques described in the patent-related references 2, 3, and patent-unrelated reference 1, there is enabled a crystal growth at a rate one order or two orders higher than those of the other melt growth methods. This leads to shorter times to be required for production of crystal, thereby enabling obtainment of a single crystal in a meaningful size with high-quality from a small amount of raw material. It is further possible to grow a crystal without eliminating impurities floating on an upper surface of melt, because the crystal is drawn through a small hole at a bottom of a crucible.

The present inventor has applied the micro-pulling-down method to fluorides, investigated an apparatus and production method therefor (patent-related reference 1), and succeeded in growing a crystal having a diameter on the order of 1 mm. However, it is becoming apparent that the crystal grown by this method is required to have an adapted shape in case of evaluation as to whether or not the crystal is suitable as a material for various usages such as solid-state laser and scintillator.

DISCLOSURE OF THE INVENTION

Problem to be Solved by the Invention

It is therefore an object of the present invention to provide a fluoride crystal production method capable of producing a fluoride crystal in an arbitrary shape.

Means for Solving the Problem

The present invention resides in a fluoride crystal production method of producing a single crystal of fluoride by pulling down a single crystal from a crucible having a hole at a bottom thereof and accommodating therein a melt of a raw fluoride material, characterized in
that the single crystal is pulled down, by forming a face at an exit portion of the hole into a desired arbitrary face shape.

It is characterized in that the crucible has an outer bottom provided with a projected portion which has a lower surface in the desired arbitrary face shape.

It is characterized in that the projected portion has a height difference of 1 mm or more.

It is characterized in that the face shape is configured to be within an extent narrower than an extent which the melt from the hole moves along.

Effect of the Invention

The present invention is configured to grow a fluoride crystal by a micro-pulling-down method and to design a crucible taking account of a wettability of a crucible material with fluoride, thereby enabling growth of fluoride crystals into various and arbitrary shapes.

EXPRESSION OF REFERENCE LETTERS

Figure 1:
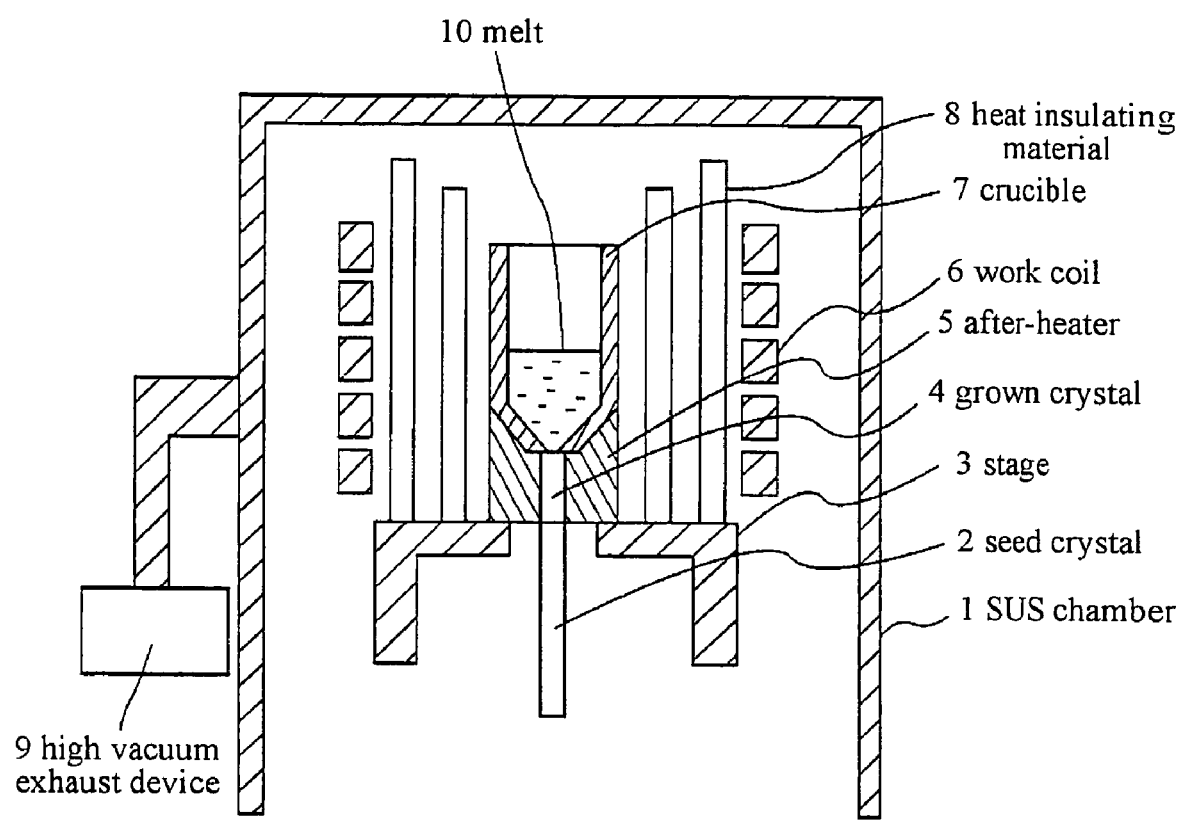
[FIG. 1] A schematic view of a controlled atmosphere/high-frequency heating type micro-pulling-down apparatus.

1 chamber
2 seed crystal
3 stage
5 after-heater
6 work coil
7 crucible
8 heat insulating material
9 exhaust apparatus
10 melt
13 hole

BEST MODE FOR CARRYING OUT THE INVENTION

The present invention resides in a method (fluoride micro-pulling-down method) of growing a single crystal of fluoride by pulling down a single crystal from a crucible having a hole at a bottom thereof and accommodating therein a melt of a raw fluoride material, and has a feature capable of controlling a shape of a grown crystal by duly designing the bottom hole of the crucible and the shape of the crucible bottom, and the like.

The melt exiting from the hole of the crucible moves along an outer surface of an outer bottom of the crucible by virtue of wettability of the melt to the crucible. The extent to be wetted by the melt varies depending on properties (such as material, surface roughness, and the like) of the crucible, properties (such as diameter, length, and the like) of the hole, and properties (such as material, temperature, and the like) of the melt. There is obtained a wettable extent depending on the crucible, melt, and hole. Designing the outer surface of the crucible bottom into an arbitrary face shape within the wettable extent, enables growth of a crystal commensurating with the arbitrary face shape.

The face shape can be made into arbitrary ones. Examples thereof include a circle, ellipse, square, rectangle, and other polygons, and each face shape can be designed into arbitrary dimensions equal to or larger than dimensions of the hole insofar as within the wettable extent.

Although the face shape can be formed on the crucible itself, it is also possible that a projection formed in a desired shape is mounted on the crucible.

It is desirable that the projection has a height difference (a vertical length relative to a bottom surface of the crucible) of 1 mm or more. Height differences of 1 mm or more enable prevention of a climb of a melt having a good wettability, thereby enabling a single crystal to be pulled down and formed into an arbitrary shape. Note that 5 mm is desirable as an upper limit. Exceeding 5 mm leads to an elongated passage for a melt, thereby possibly causing a negative effect. 1.5 mm to 3 mm are preferable.

The crucible characterizedly has an outer bottom provided with a projected portion which has a lower surface in the desired arbitrary face shape.

Although the wettable extent varies depending on properties of the crucible, properties of the hole, and properties of the melt, it is enough to previously obtain the individual properties by experiments or the like so as to correspondingly design a face shape of an outer surface of the crucible bottom.

For example, in case of adopting a platinum or iridium crucible, platinum and iridium each has a relatively excellent wettability with fluoride. As such, there is seen a phenomenon that a melt climbs up the crucible therealong, when a shape of the crucible is not taken into consideration. The present invention has a feature to rather utilize this phenomenon in a manner to devise a shape of a bottom surface of the crucible, thereby enabling a shape of crystal to be controlled. Namely, it is possible to grow a crystal having a diameter of 2 mm or more (diameter of 2 to 5 mm) which is difficult in production by a carbon crucible, and so is a crystal having a diameter of 2 mm or less (diameter of 0.5 to 2 mm) of course.

In this case, the bottom hole of the crucible is to be 0.2 to 0.5 mm in diameter, the bottom surface having the hole, i.e., the wettable portion which a melt moves along by wetting, is made to be about 0.5 to 5 mm in diameter, and there is adopted a structure that the melt is prevented from climbing up the crucible therealong, thereby enabling growth of a crystal depending on the shape of the wettable portion.

Further, configuration of a crucible bottom shape exemplarily having a width of 0.5 mm and a length of 10 mm enables a growth of crystal which is plate-like as a whole, while configuration exemplarily having a 3 mm square shape enables a growth of crystal which is square in cross-section.

The small hole may be provided singly at a center or appropriate position of a bottom surface of the projected portion, or plurally at appropriate positions of the bottom surface of the projected portion.

Figure 2:
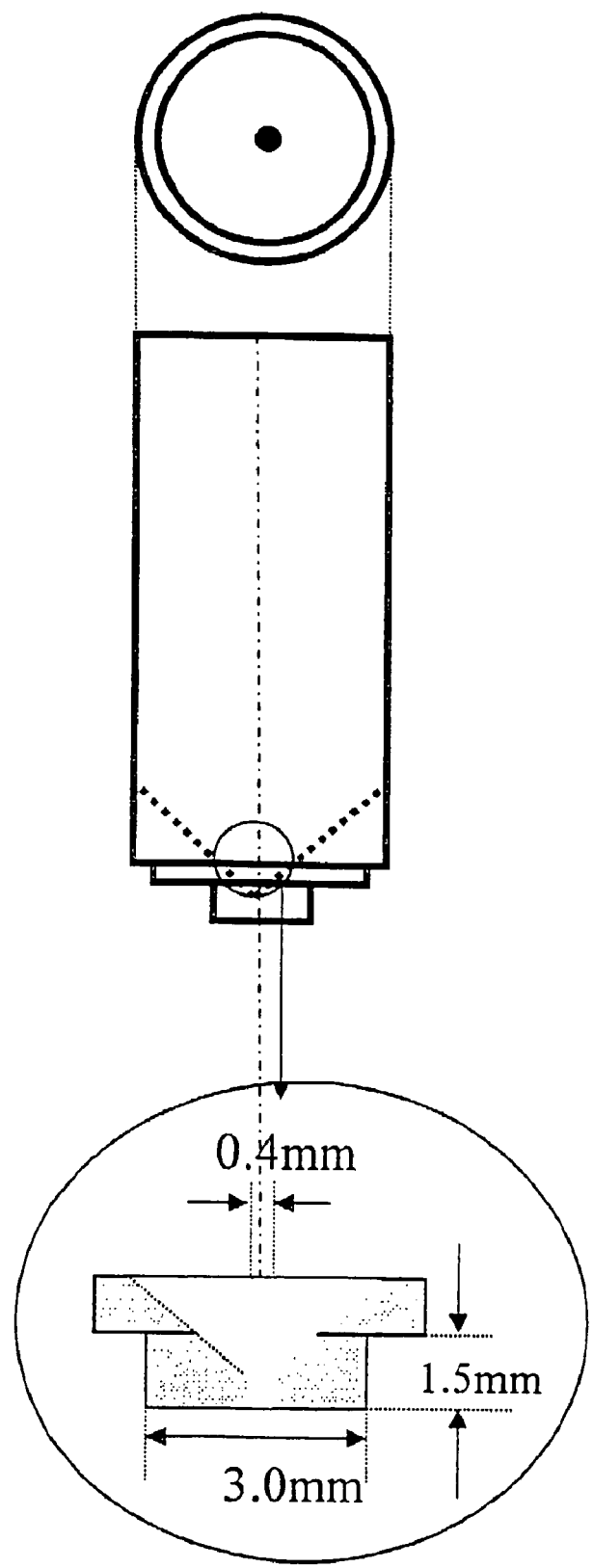
[FIG. 2] A schematic view of a platinum crucible provided with a small hole and a projected portion at a bottom of the crucible.

FIG. 1 and FIG. 2 show a fluoride crystal production apparatus according to an embodiment of the present invention.

This fluoride crystal production apparatus is configured to produce a single crystal of fluoride by pulling down a single crystal 4 from a crucible 7 accommodating therein a melt 10 of a fluoride raw material, in a manner that fluoride crystals in various shapes can be obtained by using crucibles capable of growing such crystals, respectively.

This apparatus has a chamber 1. The chamber 1 is made of stainless (SUS316).

The chamber 1 is connected with an exhaust device 9. In this embodiment, the exhaust device 9 exemplarily comprises a rotary pump including an accompanied diffusion pump (not shown), so as to enable high vacuum exhaustion which is most important in growth of fluoride crystal. This enables a degree of vacuum within the chamber 1 to be $1.3 \times 10^{-3}$ Pa or lower. There is further provided a gas inlet (not shown) for introducing a gas such as Ar into the chamber 1. Note that it is desirable to use a gas including impurities at a concentration of 10 ppb or less.

The chamber 1 is provided with a window for observing the inside thereof. Through this window, it is possible to observe a solid-liquid interface between a seed crystal 2 and the melt exiting from the hole with CCD or the like. Note that it is desirable to use a material made of $CaF_2$ for the window.

Provided inside the chamber 1 is a stage 3. Further, provided on the stage 3 are the crucible 7 and an after-heater 5.

Outwardly provided around the crucible 7 are heat insulating materials 8 in a two layered manner, and a work coil 6 is outwardly provided therearound. The work coil functions to melt a fluoride raw material within the crucible 7 into a melt.

The seed crystal 2 is arranged at the bottom of the crucible 7, oppositely to the hole. The seed crystal 2 is pulled down by a pull-down rod or the like. The after-heater 5 is provided outwardly around a grown crystal on the seed crystal 2, so as to prevent occurrence of heat distortion of the grown crystal due to rapid cooling thereof.

In case that the above described apparatus adopts a platinum crucible as shown in FIG. 2 such that the bottom thereof is provided with a small hole of 0.2 to 0.5 mm in diameter while providing a projected portion of 0.5 to 5 mm in diameter at the bottom surface of the crucible, it becomes possible to grow a crystal having a cross-sectional shape identically to a shape of a bottom surface of the projected portion. It is further possible to grow a plate-like crystal by exemplarily adopting a shape of 0.5 mm width and 10 mm length for the crucible bottom, or a square crystal by exemplarily adopting a 3 mm square shape.

EXAMPLE 1

The apparatus shown in FIG. 1 was used to produce a barium fluoride crystal.

In this Example, the platinum crucible as shown in FIG. 2 was adopted to produce a barium fluoride crystal. This crucible had a hole having a diameter of 0.4 mm, and a bottom surface having a diameter of 3 mm. Further, there was provided a projected portion, lest a melt climb up. Its height difference was made to be 1.5 mm.

After filling a barium fluoride powder and setting the seed crystal 2, stage 3, after-heater 5 and heat insulating materials 8 as shown in FIG. 1, there was conducted high vacuum exhaustion by an oil-sealed rotary vacuum pump and an oil diffusion pump.

It was confirmed that a reached degree of vacuum was $1.3 \times 10^{-3}$ Pa or lower, and the inside of the chamber 1 was displaced by an Ar gas. Thereafter, the barium fluoride powder was heated and melted by the high-frequency coil 6. The melt had a temperature of 1,350° C.

While monitoring the bottom of the crucible 7 by a CCD camera, the seed crystal was attached to the melt exiting from the small hole at the bottom of the crucible 7 in a manner to solidify the melt while pulling it down.

Figure 3:
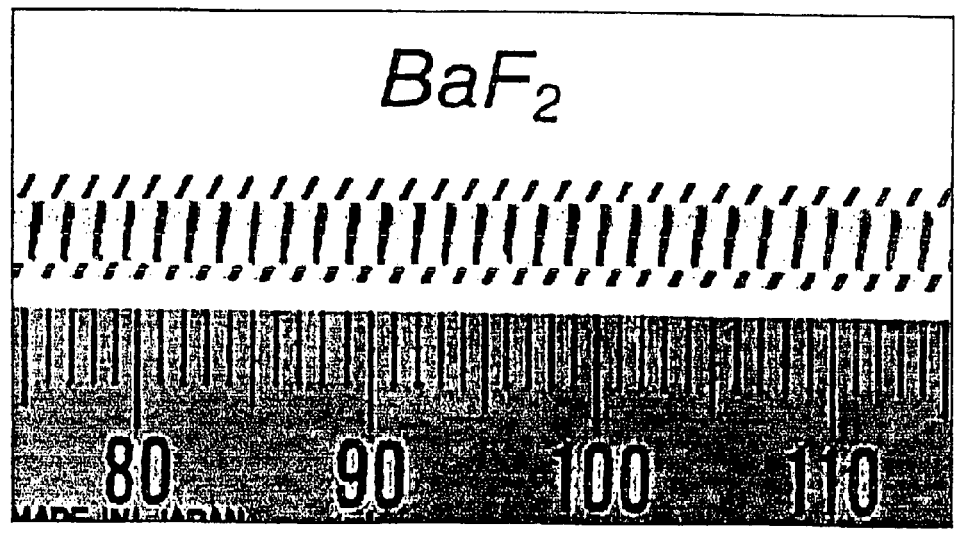
[FIG. 3] An optical photograph instead of a figure, of barium fluoride having a diameter of 3 mm described in Example 1.

Upon contacting the seed crystal 2 with the melt 10 having reached a tip end of the small hole of the crucible, the melt progressively spread on the bottom surface of the projected portion, and finally spread over the entire bottom surface. This phenomenon was caused, because platinum has a relatively excellent wettability with fluoride. As a result that the seed crystal in this state was pulled down at a rate of 0.3 mm/min, there was obtained a colorless and transparent crystal of barium fluoride (FIG. 3) having a length of 50 mm and cross-sectionally sectionally having the shape of the projected portion which was 3 mm in diameter in this Example.

EXAMPLE 2

Figure 4:
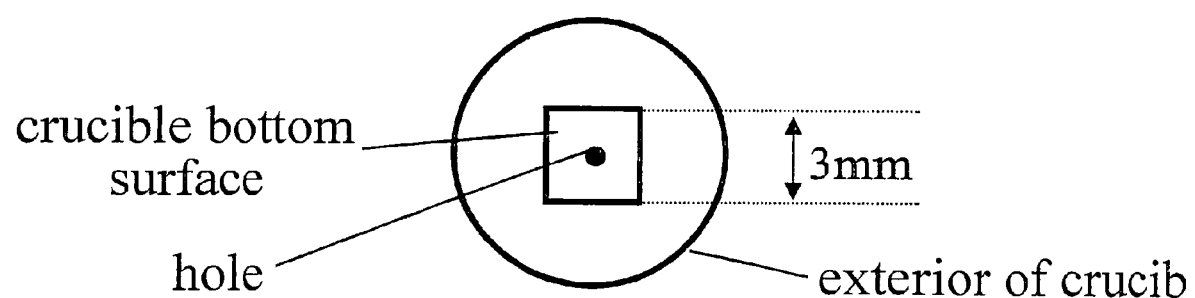
[FIG. 4] A schematic view of a bottom shape of an iridium crucible described in Example 2.

There was used an iridium crucible generally in the shape shown in FIG. 2 but having a bottom surface in a square shape one side of which was 3 mm as shown in FIG. 4, thereby producing a cerium-added praseodymium fluoride crystal to be used as a scintillator.

This crucible had a hole of 0.4 mm in diameter. Further, there was provided a projected portion lest a melt climb up. Its height difference was made to be 1.5 mm.

Figure 5:
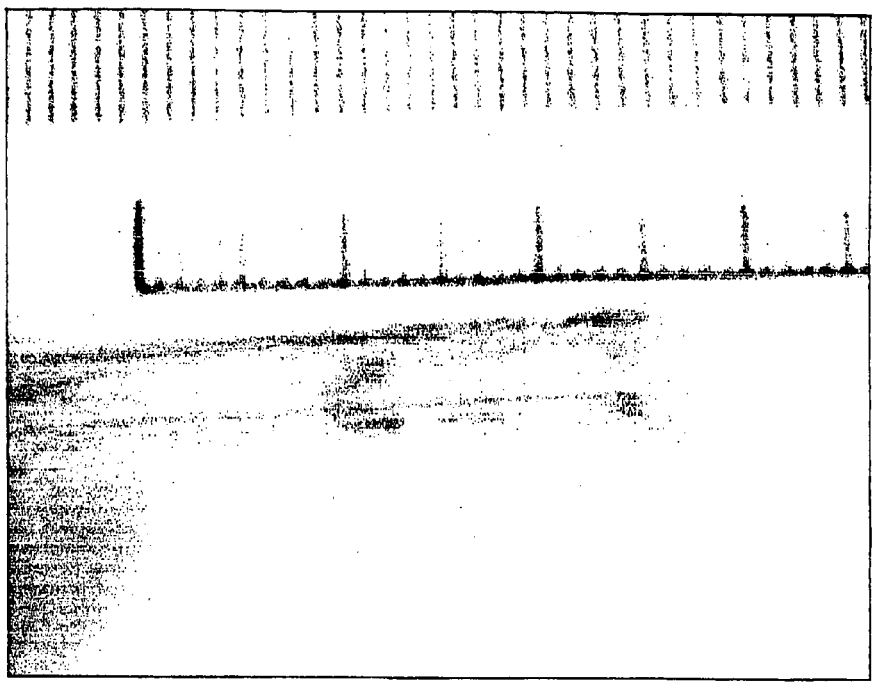
[FIG. 5] An optical photograph instead of a figure, of a cerium-added praseodymium fluoride crystal in a 3 mm square shape described in Example 2.

Upon contacting the seed crystal 2 with the melt 10 having reached a tip end of the small hole of the crucible, the melt progressively spread on the bottom surface of the projected portion, and finally spread over the entire bottom surface. This phenomenon was caused, because iridium has a relatively excellent wettability with fluoride, similarly to platinum. As a result that the seed crystal was pulled down at a rate of 0.2 mm/min in a procedure similar to Example 1, there was obtained a cerium-added praseodymium fluoride crystal (FIG. 5) having a length of 30 mm and cross-sectionally having the shape of the projected portion which was square one side of which was 3 mm.

EXAMPLE 3

Figure 6:
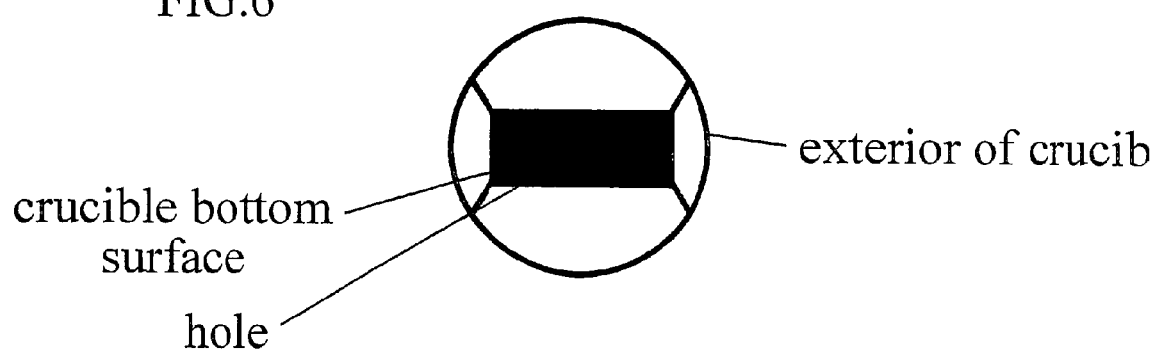
[FIG. 6] A schematic view of a bottom shape of an carbon crucible described in Example 3.

There was used a carbon crucible having a bottom surface in a shape of FIG. 6, thereby producing a cerium-added praseodymium fluoride crystal to be used as a scintillator. This crucible had a hole in an elongated rectangular shape of 1 mm×10 mm. No projected portions were provided.

Figure 7:
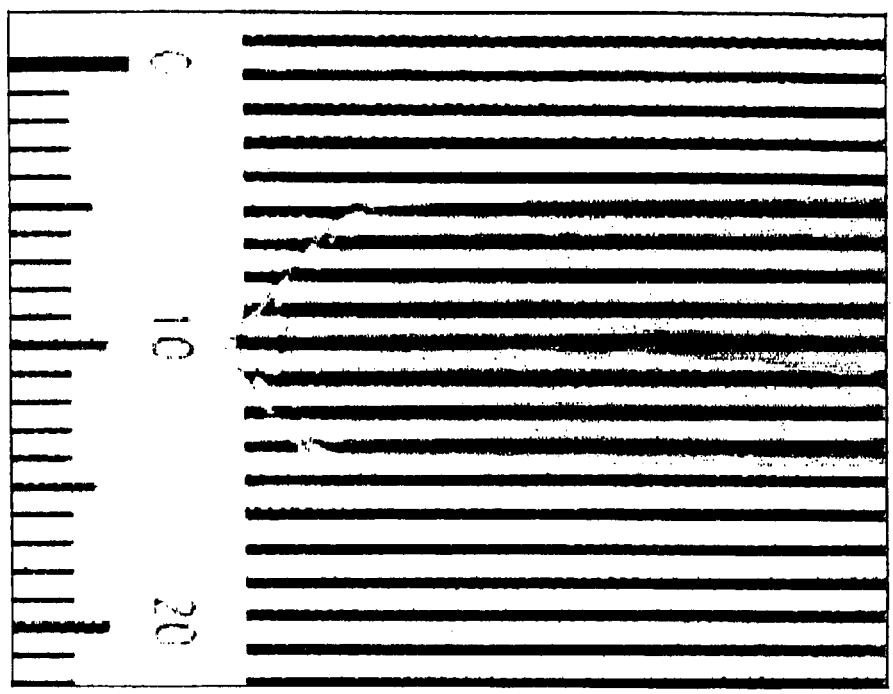
[FIG. 7] An optical photograph instead of a figure, of a cerium-added praseodymium fluoride crystal in a 1 mm×10 mm plate shape in Example 3.

Upon contacting the seed crystal 2 with the melt 10 having reached a tip end of the small hole of the crucible, the melt did not spread on the bottom surface of the projected portion and there was started growth of a crystal in the shape of the hole, unlike the cases of platinum and iridium. This phenomenon was caused, because carbon has an extremely poor wettability with fluoride. As a result that the seed crystal was pulled down at a rate of 0.1 mm/min in a procedure similar to Example 1, there was obtained a cerium-added praseodymium fluoride crystal (FIG. 7) in a plate-like shape having a length of 40 mm and a cross-section of 1 mm×10 mm.

There have been explained barium fluoride and praseodymium fluoride as examples of fluorides while adopting as crucibles the platinum, iridium, and carbon ones in the above Examples, respectively, and it can be concluded that crystal shapes each depend on the shape of a bottom surface of a projection provided at the bottom of the crucible because of a relatively excellent wettability when the crucible is made of platinum or iridium, and that a crystal shape depends on a shape of the hole provided at the bottom of the crucible due to a poor wettability when the crucible is made of carbon.

INDUSTRIAL APPLICABILITY

The present invention is configured to grow a fluoride crystal by a micro-pulling-down method and to design a crucible taking account of a wettability of a crucible material with fluoride, thereby enabling growth of fluoride crystals into various and arbitrary shapes.

The invention claimed is:

1. A method of producing a single crystal of fluoride having a predetermined cross-sectional configuration, comprising providing a crucible having a hole at a bottom thereof whose shape is the same as said predetermined crosssectional configuration, providing melted fluoride material in said crucible, and pulling down a single crystal from said fluoride material through said hole.

2. The fluoride crystal production method of claim 1, wherein the crucible has an outer bottom provided with a projected portion which has a lower surface in said predetermined cross-sectional configuration.

3. The fluoride crystal production method of claim 2, wherein the projected portion has a height difference of 1 mm or more.

4. The fluoride crystal production method of claim 3, wherein the hole is provided in plural.

5. The fluoride crystal production method of claim 3, wherein said face shape is configured to be within an extent narrower than an extent which the melt from the hole moves along.

6. The fluoride crystal production method of claim 2, wherein the hole is provided in plural.

7. The fluoride crystal production method of claim 2, wherein said face shape is configured to be within an extent narrower than an extent which the melt from the hole moves along.

8. The fluoride crystal production method of claim 1, wherein the hole is provided in plural.

9. The fluoride crystal production method of claim 8, wherein said face shape is configured to be within an extent narrower than an extent which the melt from the hole moves along.

10. The fluoride crystal production method of claim 1, wherein said face shape is configured to be within an extent narrower than an extent which the melt from the hole moves along.

11. The fluoride crystal production method of claim 1, further comprising providing a seed crystal in said hole prior to pulling down said single crystal.

* * * * *